(12) United States Patent
Bobde et al.

(10) Patent No.: US 9,793,254 B2
(45) Date of Patent: Oct. 17, 2017

(54) TVS STRUCTURES FOR HIGH SURGE AND LOW CAPACITANCE

(71) Applicants: Madhur Bobde, Sunnyvale, CA (US); Wenjiang Zeng, Sunnyvale, CA (US); Limin Weng, Shanghai (CN)

(72) Inventors: Madhur Bobde, Sunnyvale, CA (US); Wenjiang Zeng, Sunnyvale, CA (US); Limin Weng, Shanghai (CN)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/565,392

(22) Filed: Dec. 9, 2014

(65) Prior Publication Data

US 2017/0141097 A1   May 18, 2017

(51) Int. Cl.
| | |
|---|---|
| *H01L 21/336* | (2006.01) |
| *H01L 27/02* | (2006.01) |
| *H01L 21/822* | (2006.01) |
| *H01L 21/283* | (2006.01) |

(52) U.S. Cl.
CPC ........ *H01L 27/0248* (2013.01); *H01L 21/283* (2013.01); *H01L 21/822* (2013.01)

(58) Field of Classification Search
None
See application file for complete search history.

(56) References Cited

U.S. PATENT DOCUMENTS

| | | |
|---|---|---|
| 8,338,854 B2 | 12/2012 | Bobde et al. |
| 8,835,917 B2 | 9/2014 | Bobde et al. |
| 2010/0244090 A1* | 9/2010 | Bobde .............. H01L 27/0259 257/112 |

OTHER PUBLICATIONS

Cheng Xiaofei, Research of High Speed Deep Trench TVS, Aug. 18, 2010, Chinese Scientific Papers: http://www.paper.edu.cn; with english translation, pp. 1-13.*
Cheng Xiaofei, "Research of High Speed Deep Trench TVS", Aug. 18, 2010—7 pages—http://www.paper.edu.cn.

* cited by examiner

*Primary Examiner* — Shaun Campbell
(74) *Attorney, Agent, or Firm* — Bo-In Lin

(57) ABSTRACT

A transient voltage suppressing (TVS) device formed in an epitaxial layer of a first conductivity type supported on a semiconductor substrate. The TVS device further comprises a plurality of contact trenches opened and extended to a lower part of the epitaxial layer filled with a doped polysilicon layer of a second conductivity type wherein the trenches are further surrounded by a heavy dopant region of the second conductivity type. The TVS device further includes a metal contact layer disposed on a top surface of the epitaxial layer electrically connected to a Vcc electrode wherein the metal contact layer further directly contacting the doped polysilicon layer and the heavy dopant region of the second conductivity type.

15 Claims, 22 Drawing Sheets

Present Invention

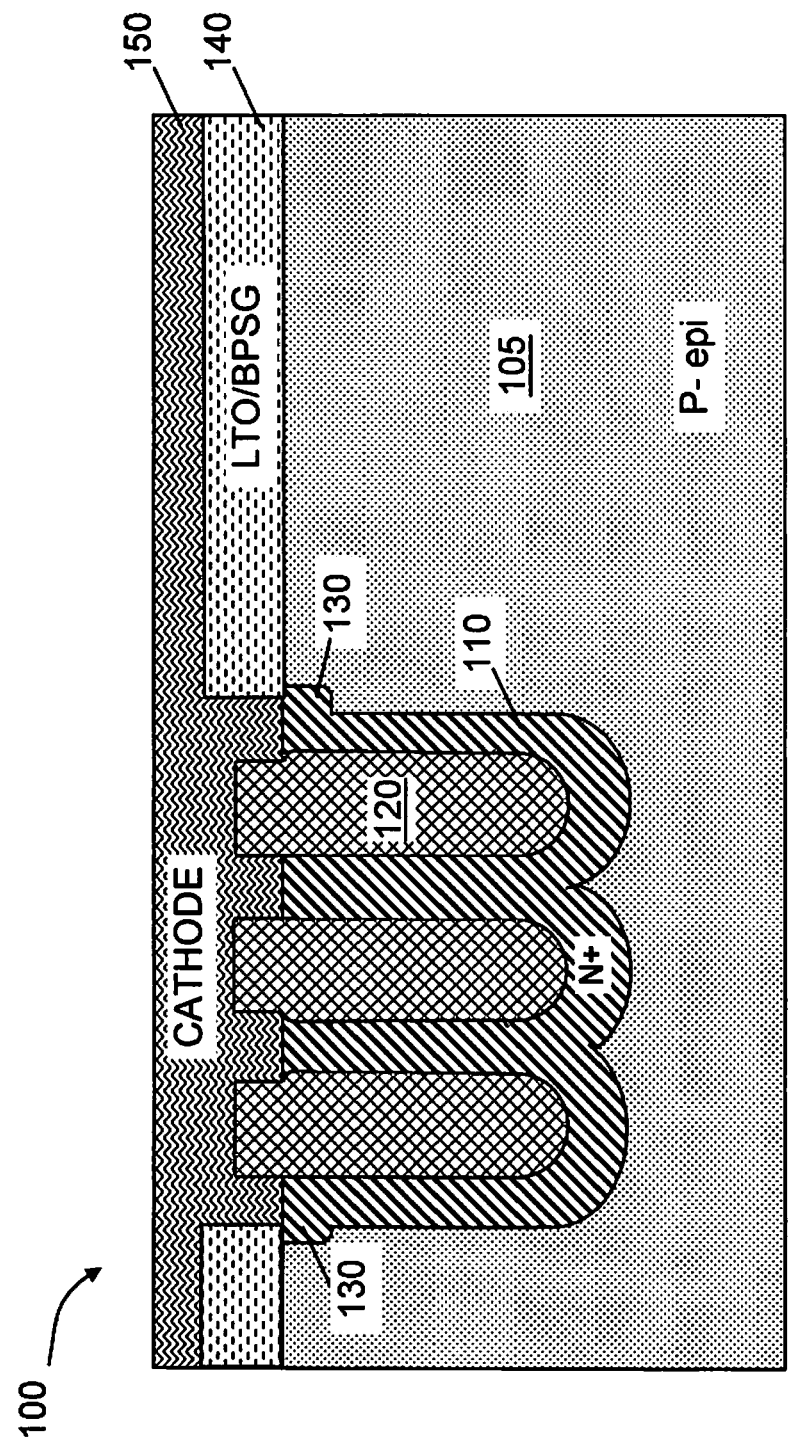
FIG. 2 Present Invention

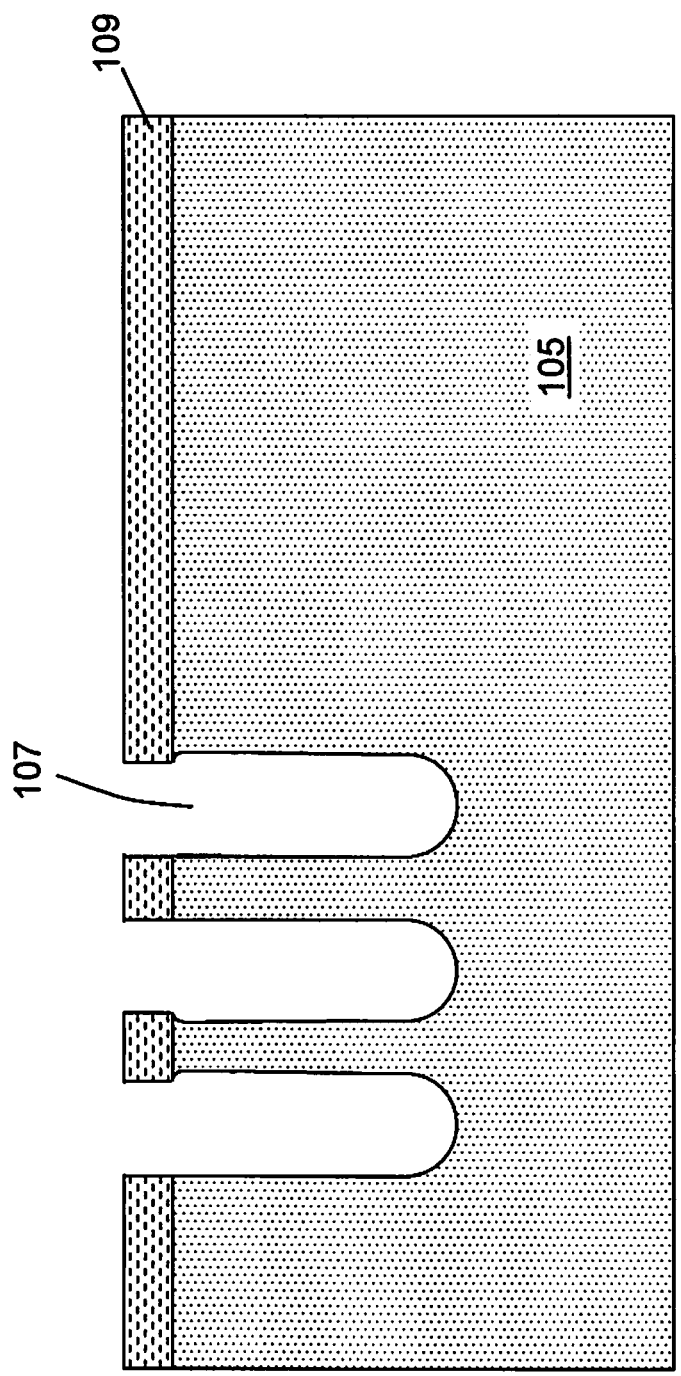
FIG. 3A Present Invention

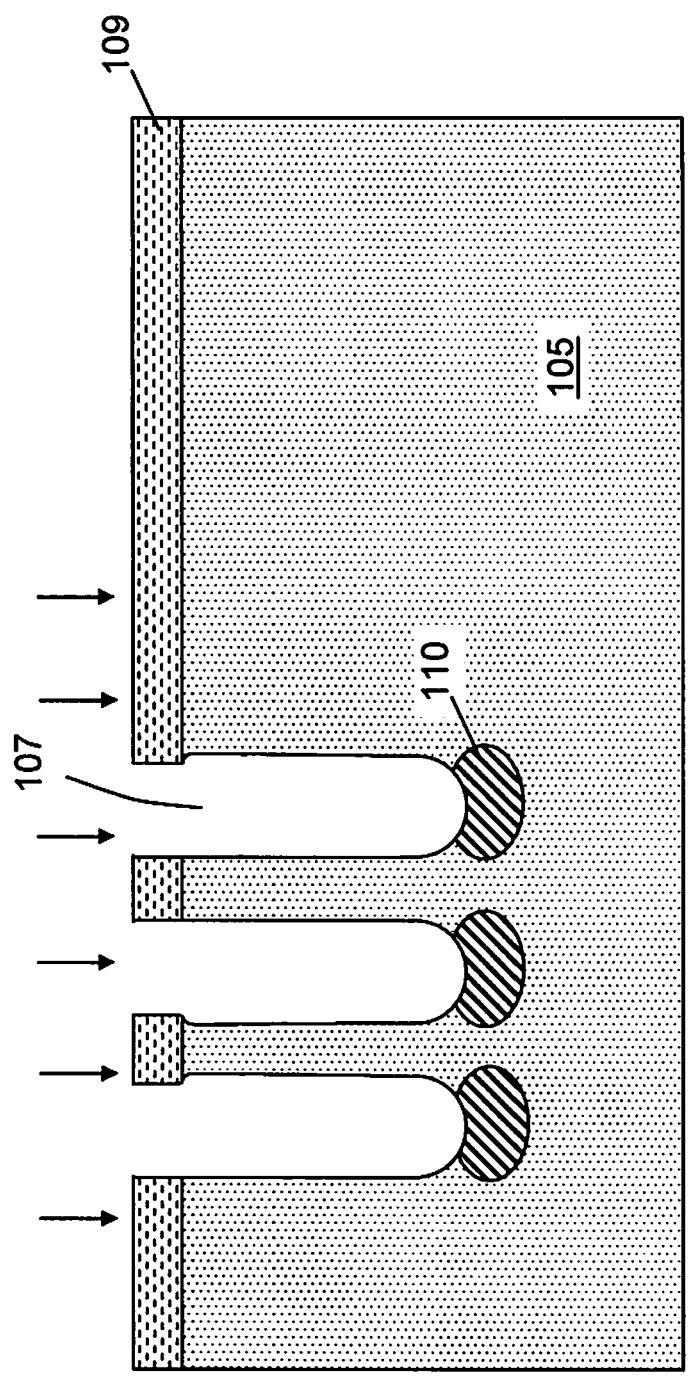
FIG. 3B Present Invention

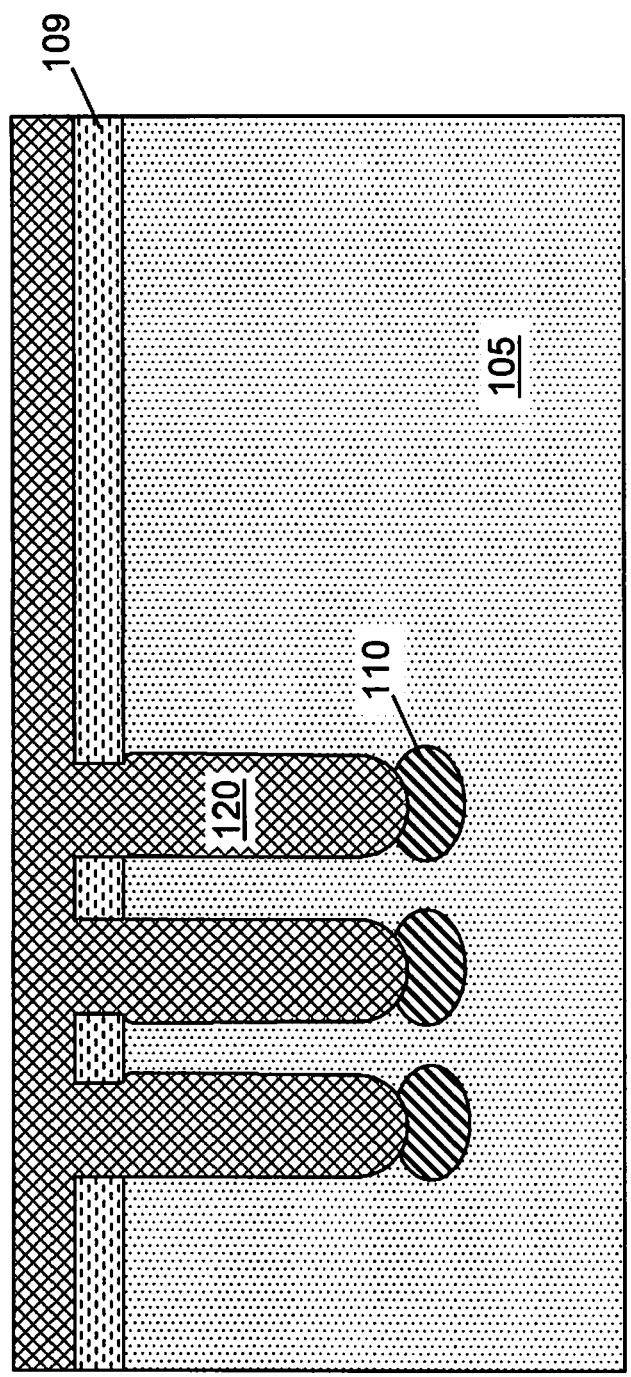
FIG. 3C Present Invention

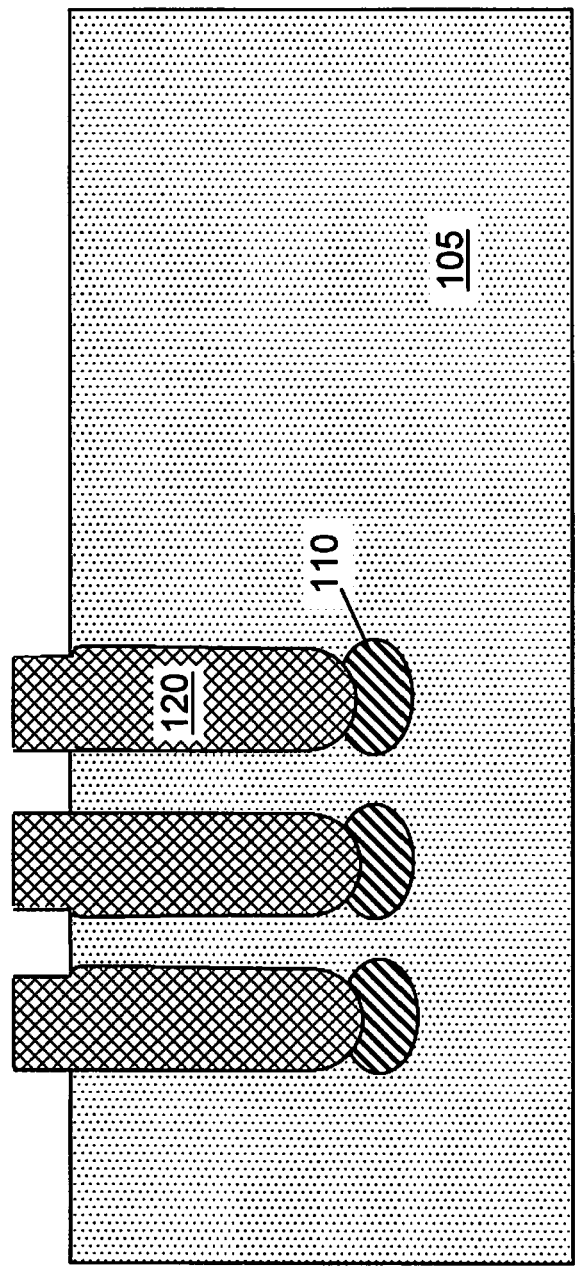
FIG. 3D Present Invention

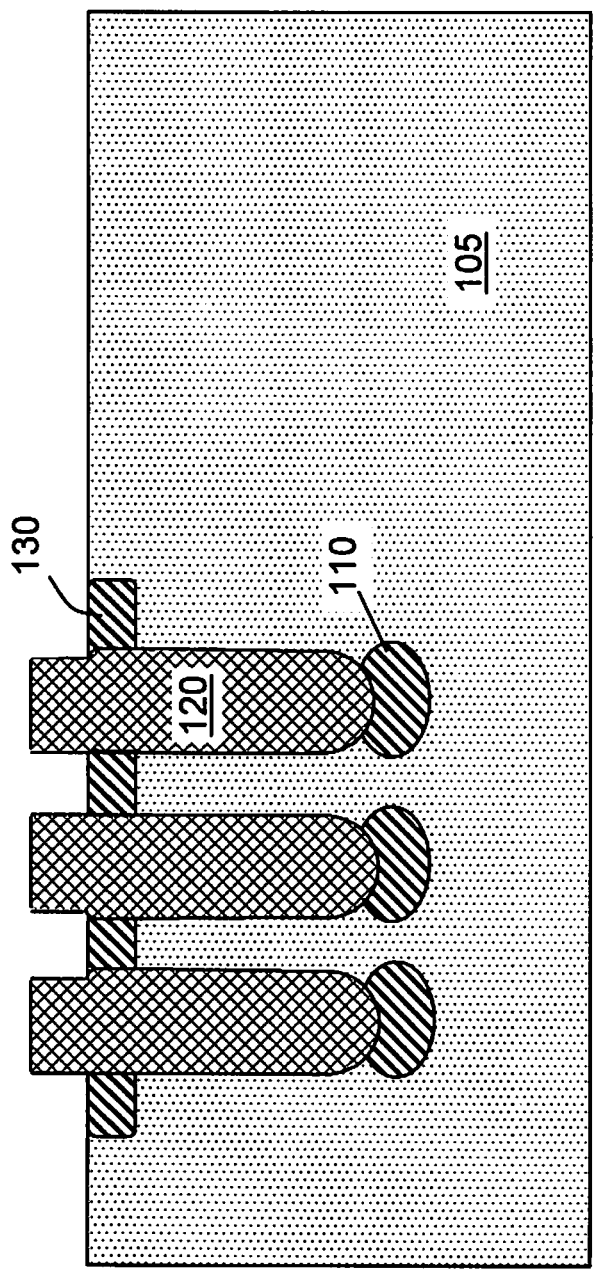
FIG. 3E Present Invention

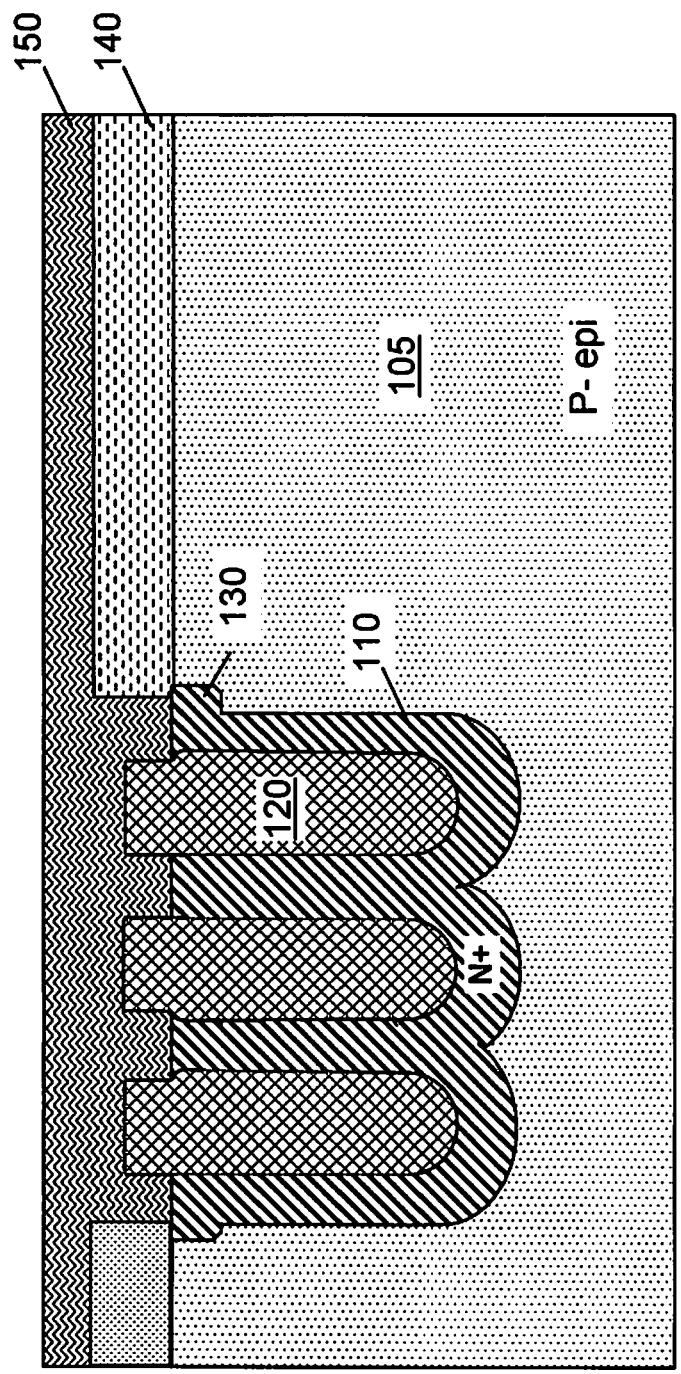
FIG. 3F Present Invention

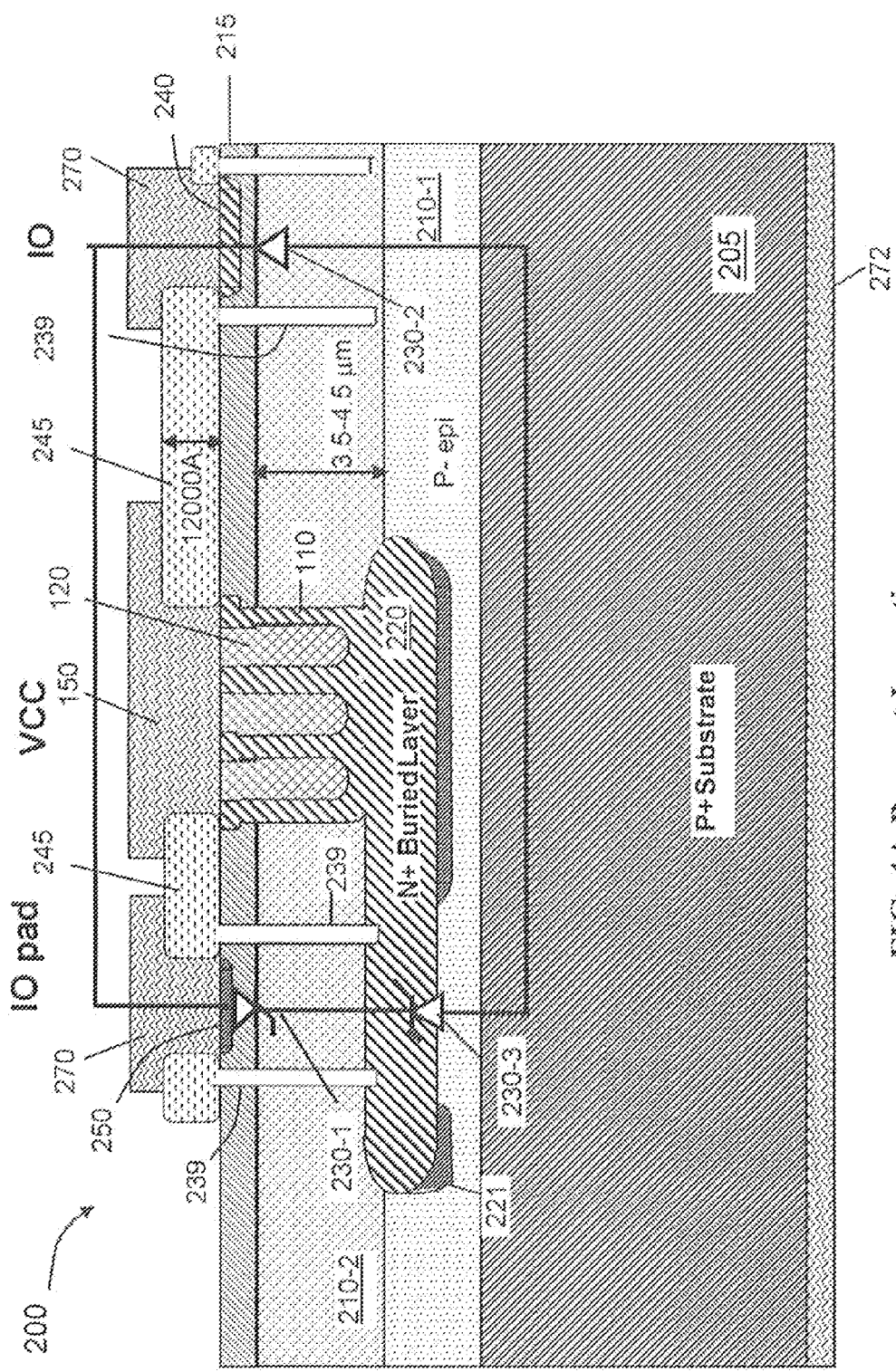
FIG. 4A Present Invention

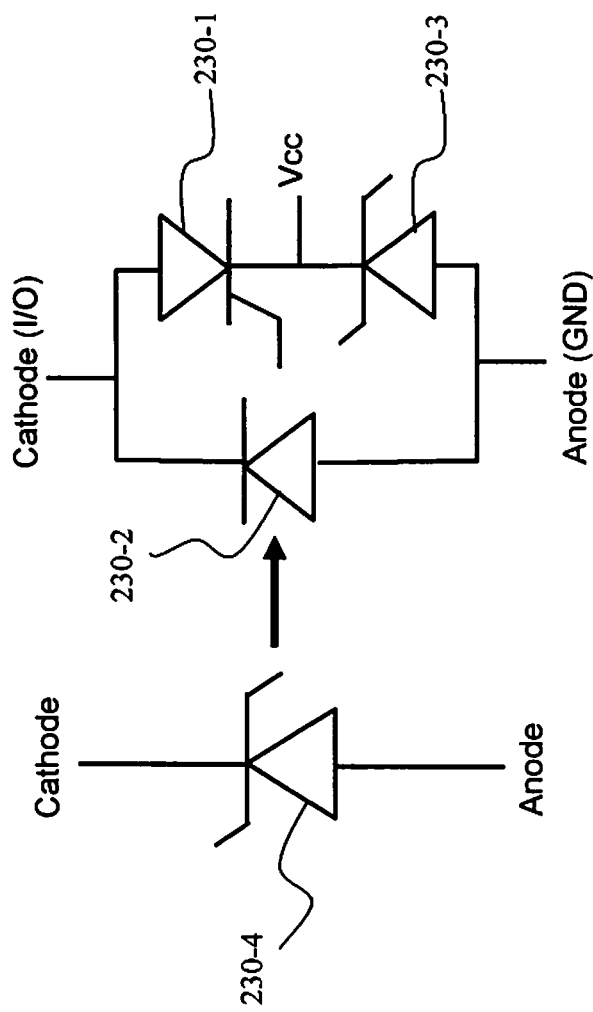
FIG. 4A-1 (Equivalent Circuit)

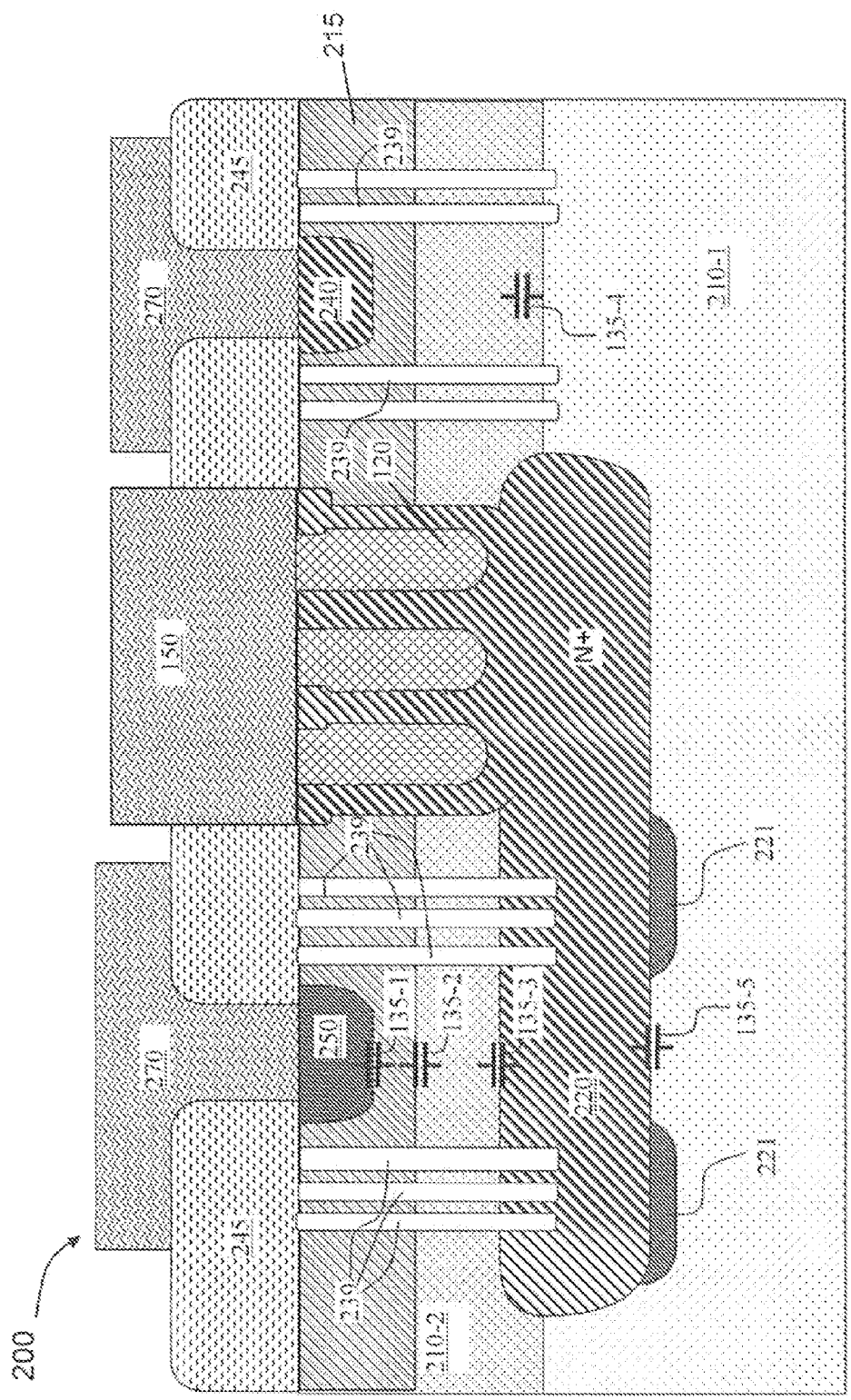
FIG. 4B Present Invention

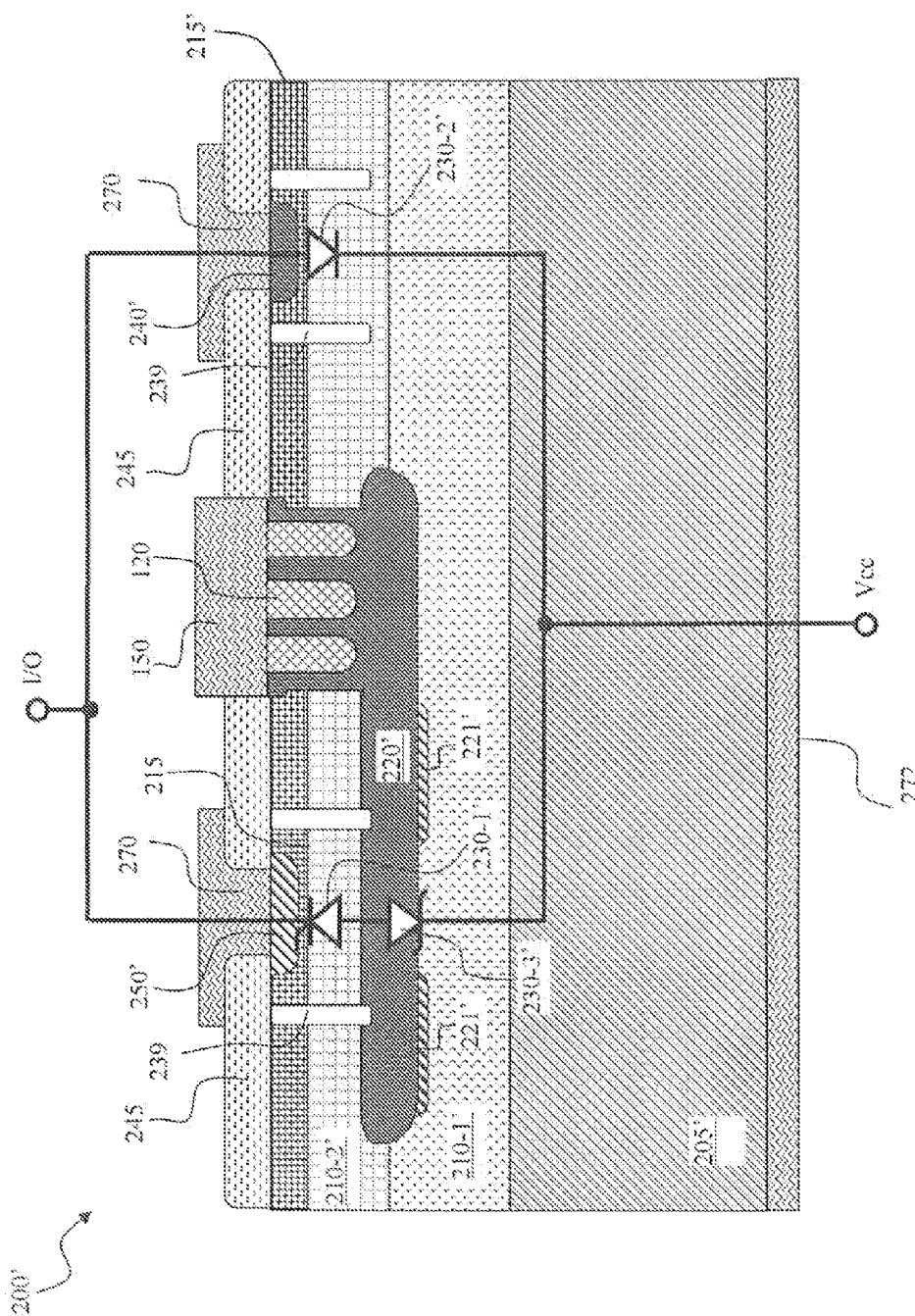
FIG. 4C Present Invention

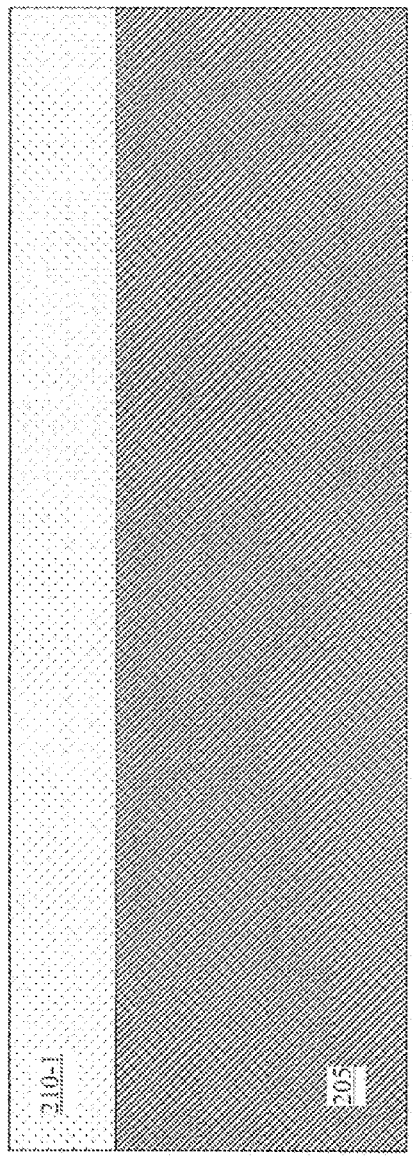
FIG. 5A Present Invention
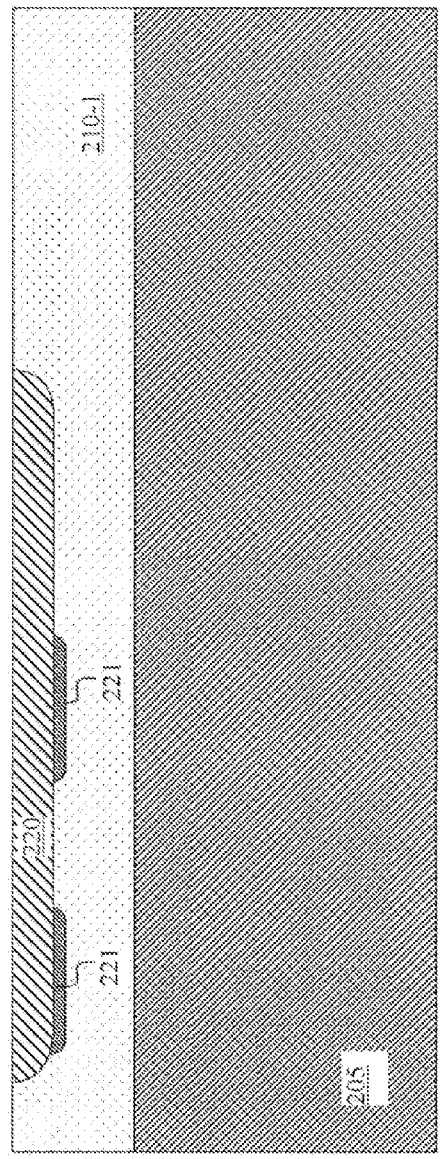
FIG. 5B Present Invention

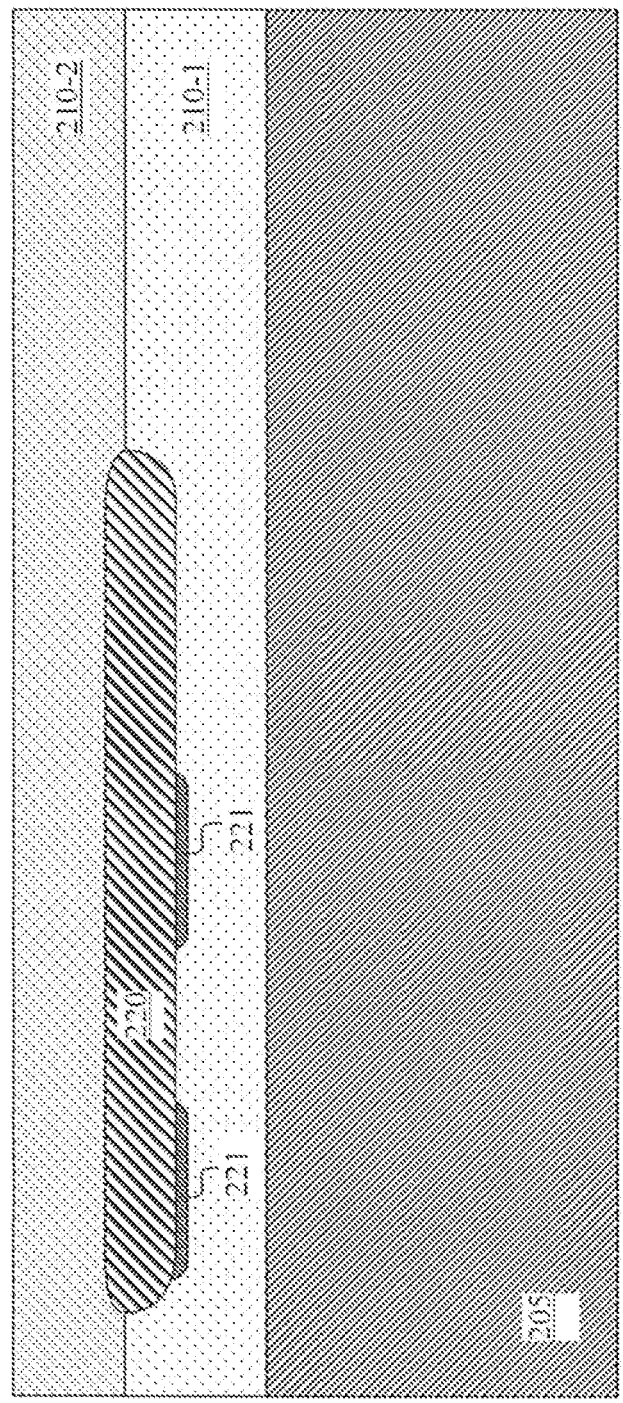
FIG. 5C Present Invention

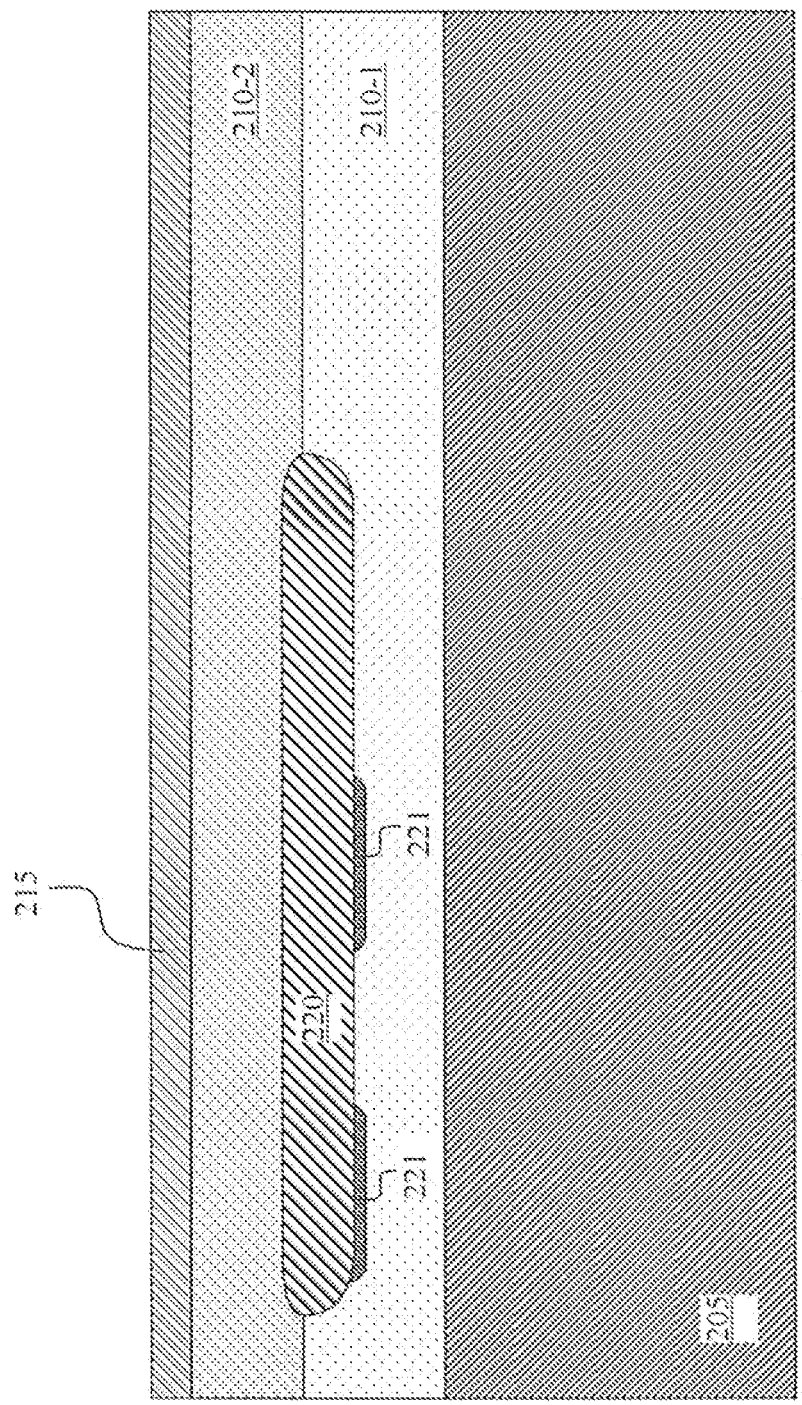
FIG. 5D Present Invention

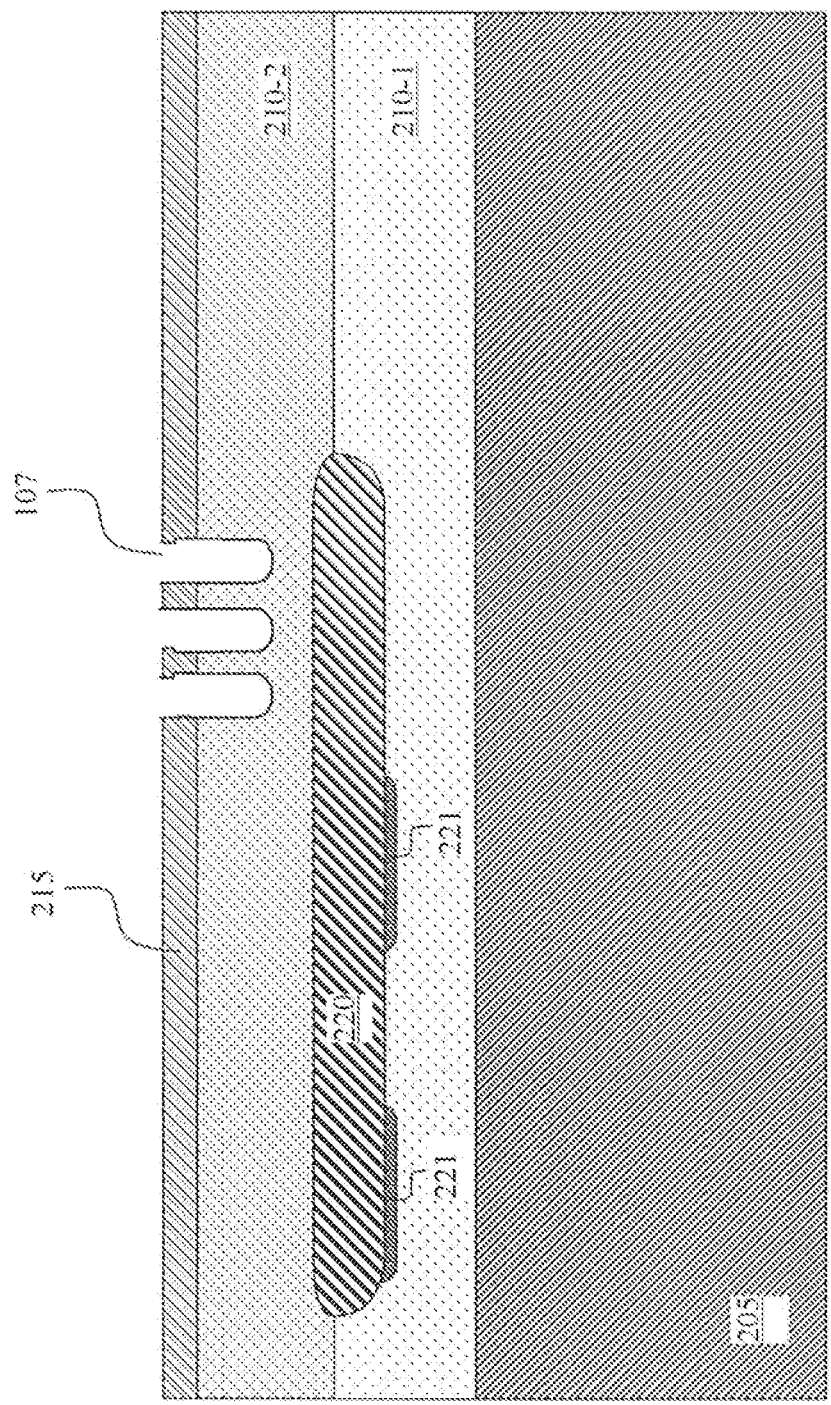
FIG. 5E Present Invention

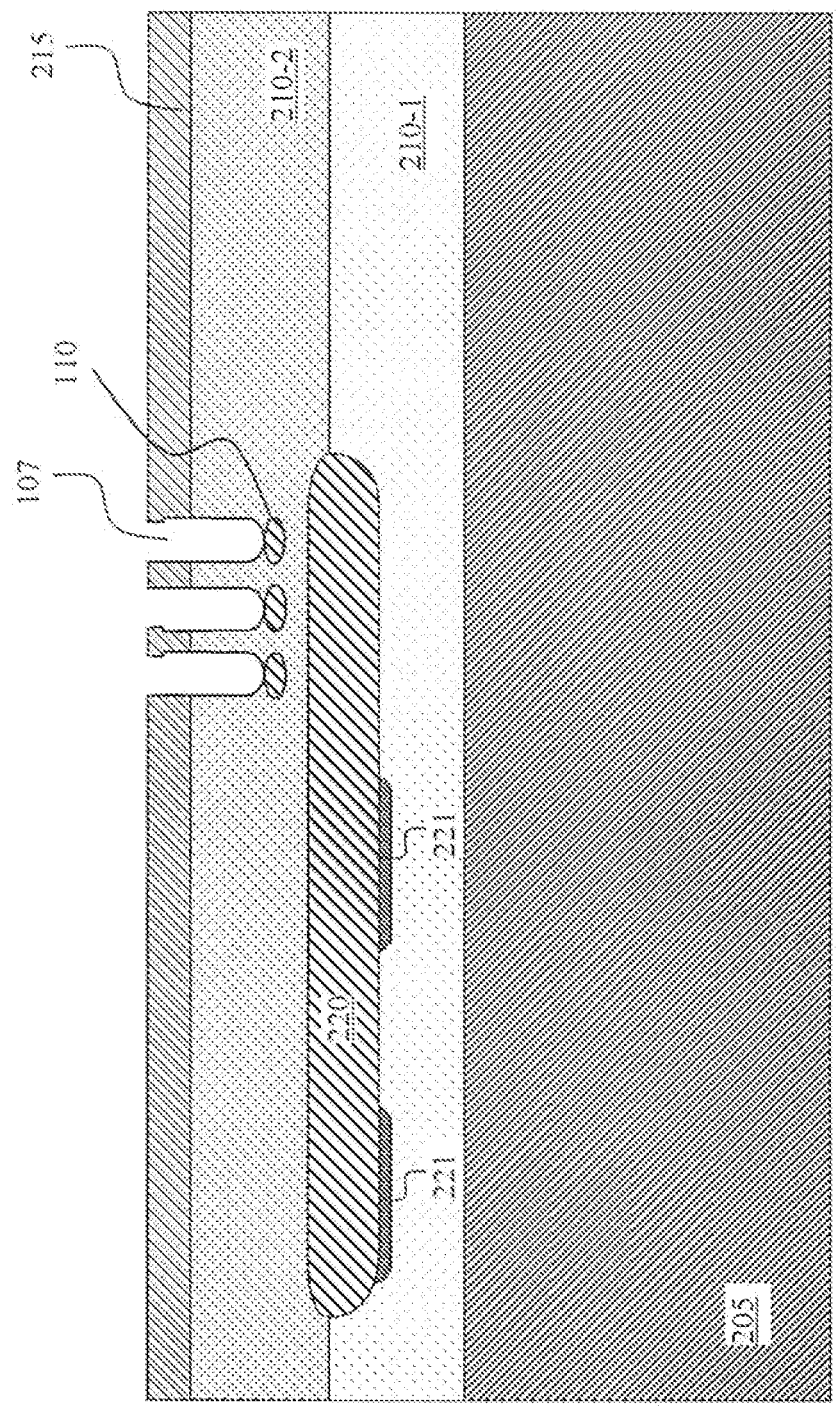
FIG. 5H Present Invention

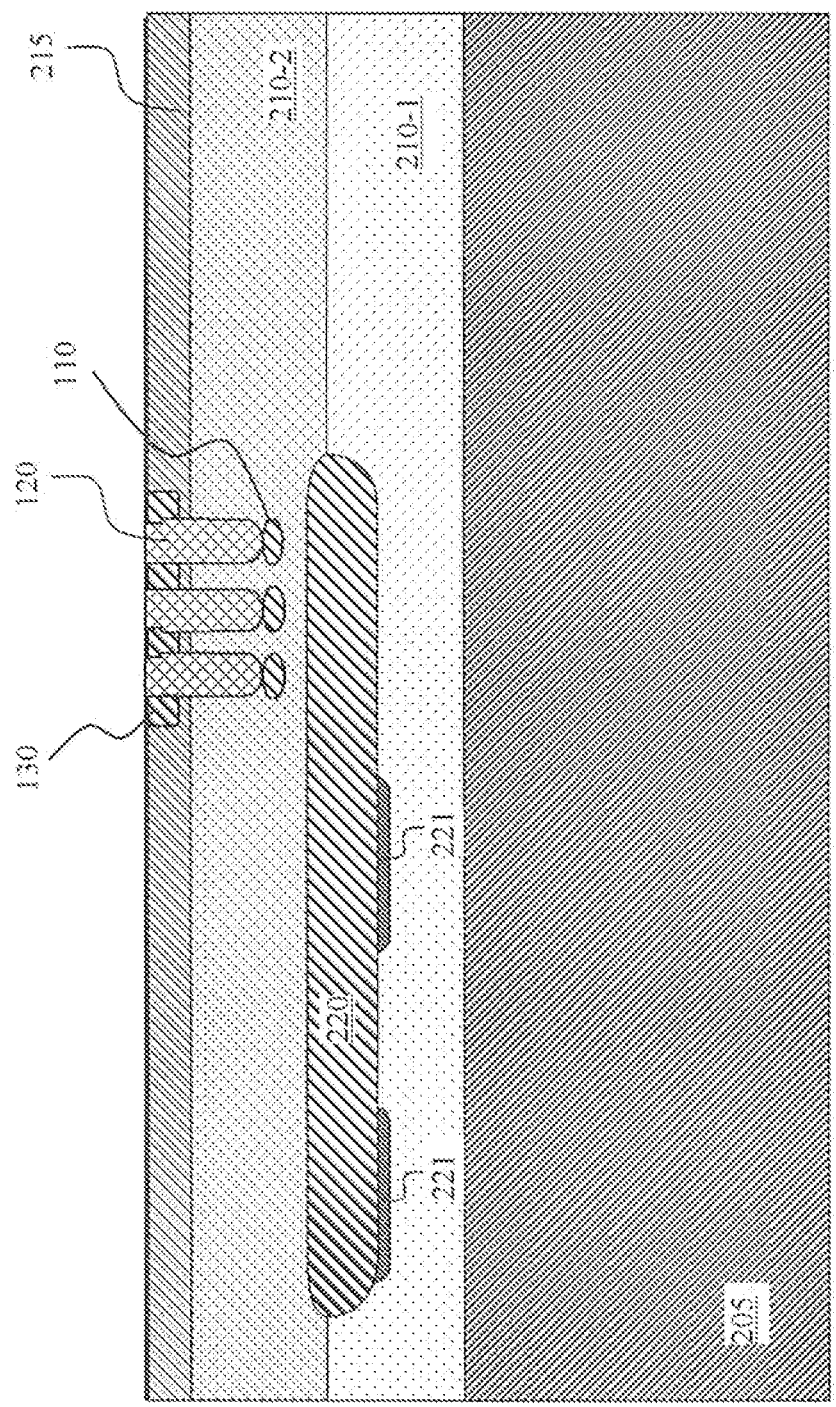

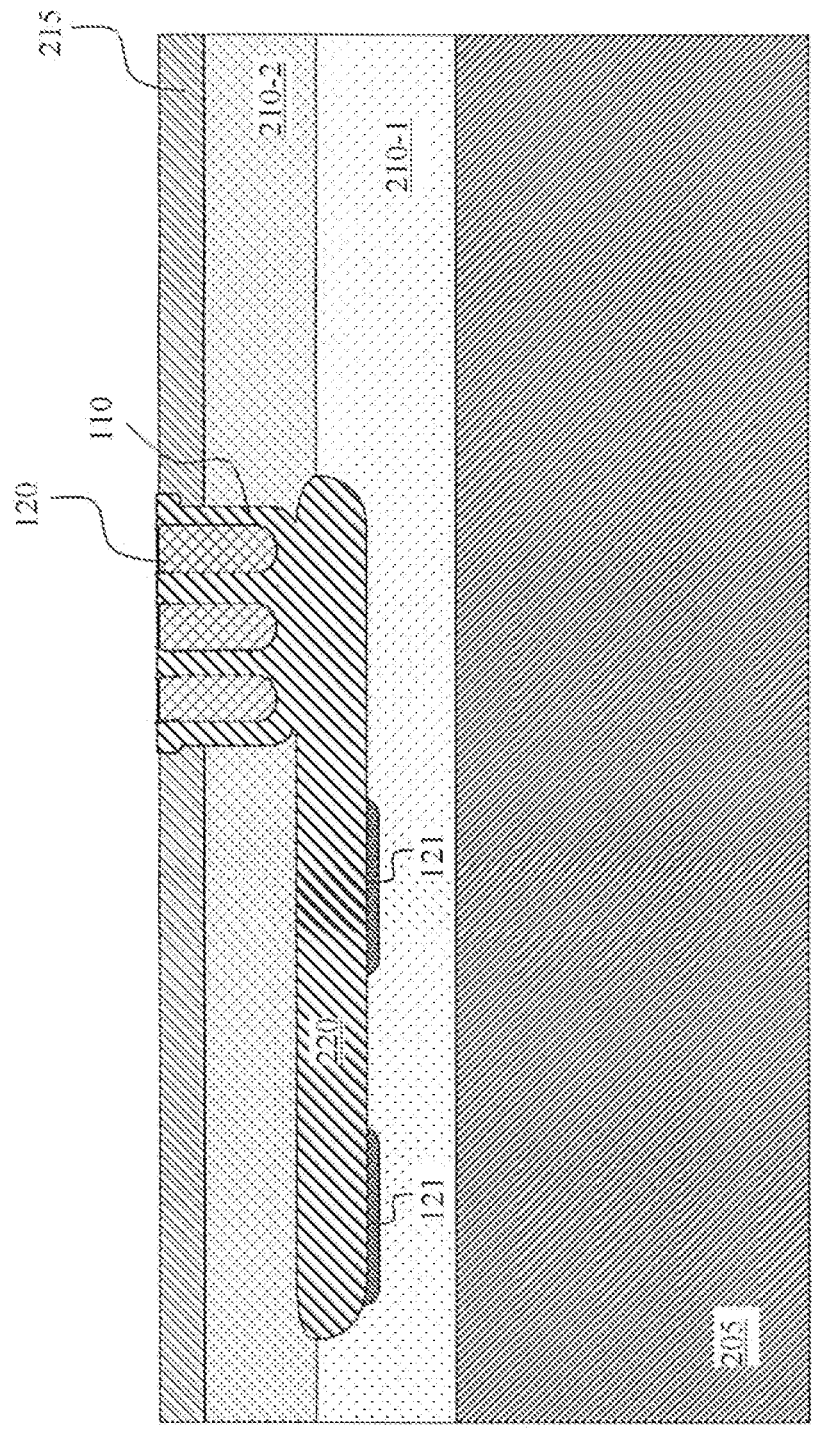
FIG. 5H Present Invention

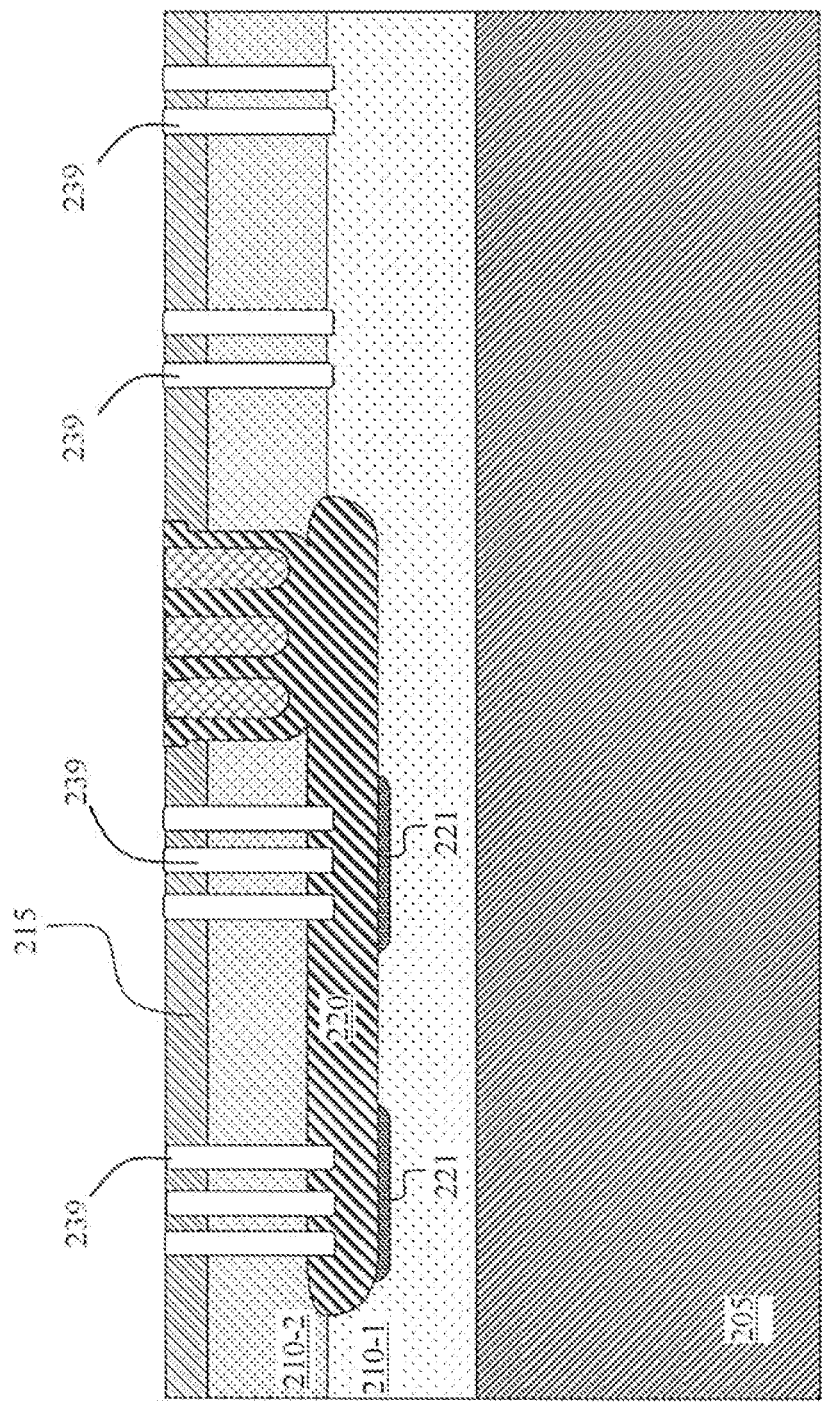
FIG. 51 Present Invention

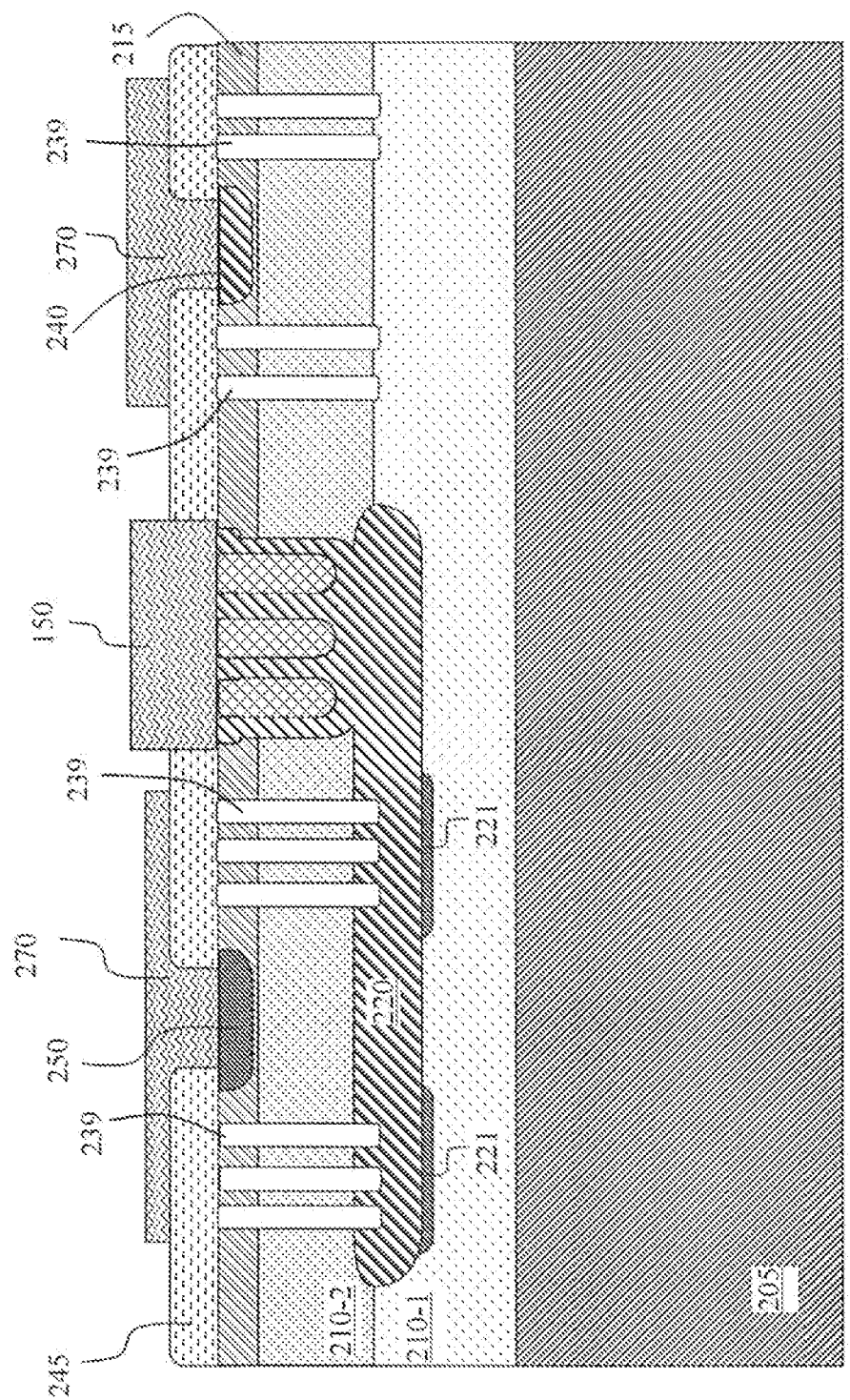
FIG. 5J Present Invention

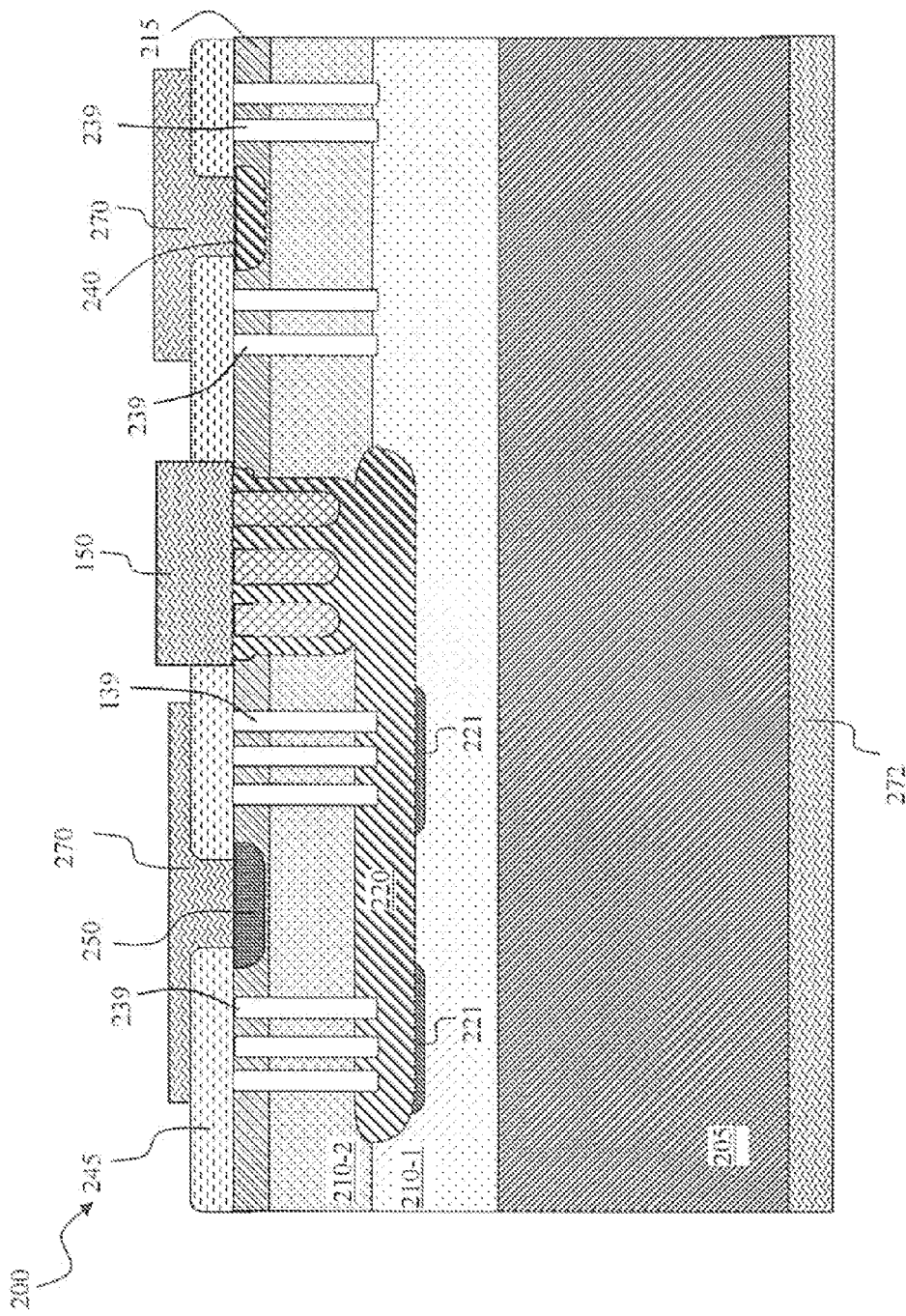
FIG. 5K Present Invention

TVS STRUCTURES FOR HIGH SURGE AND LOW CAPACITANCE

BACKGROUND OF THE INVENTION

1. Field of the Invention

The invention relates generally to a device structure and manufacture method of a transient voltage suppressor (TVS). More particularly, this invention relates to an improved device structure and manufacture method of TVS devices to handle dissipation of large amount of energy during a high transient surge and in the meantime maintaining a low capacitance for a transient voltage suppressor (TVS).

2. Description of the Relevant Art

The device configurations and method of manufacturing the transient voltage suppression (TVS) device are still confronted with the technical challenges that the TVS device fails due to overheating in handle a large amount of energy dissipation in the process of suppressing the transient voltage. Specifically, the transient voltage suppressors (TVS) are commonly applied for protecting integrated circuits from damages due to the inadvertent occurrence of an over voltage imposed onto the integrated circuit. An integrated circuit is designed to operate over a normal range of voltages. However, in situations such as electrostatic discharge (ESD), electrical fast transients and lightning, an unexpected and an uncontrollable high voltage may accidentally strike onto the circuit. The TVS devices are required to serve the protection functions to circumvent the damages that are likely to occur to the integrated circuits when such over voltage conditions occur. As increasing number of devices are implemented with the integrated circuits that are vulnerable to over voltage damages, demands for TVS protection are also increased. Exemplary applications of TVS can be found in the USB power and data line protection, Digital video interface, high speed Ethernet, Notebook computers, monitors and flat panel displays.

The challenges for the TVS device to absorb large amount of energy in short period of time is increased due to the requirements of the TVS performance with common IEC 61000 Standards of 8×20 μSecs, 10×1000 μSecs pulse surge current. With large amount of energy dissipation, the most common TVS failures often occur when the metal melts down due to overheating. It is well known that the silicon as part of the TVS device can sustain significant higher power dissipation than the metal. While the metal layer often formed near the top surface of the TVS structure and commonly implemented as electrodes or electrical contacts, the metal layer tends to melt down due to overheating. The over voltage protection functions of the TVS device are therefore compromised due to these melt down failures.

FIG. 1 is a cross sectional view of a conventional TVS device. The device structure has an intrinsic limitation due to a shallow blocking junction caused by a topside N diffusion manufacturing process. As a result, the voltage blocking region is closer to the surface that is near to the metal layer commonly formed on the top surface as electrical contacts. As the semiconductor device experiences a high transient voltage surge, the blocking junction absorbs a large amount of energy thus causing the temperature to rise rapidly. The elevated temperature takes place locally near the metal may lead to overheating followed by melting the metal disposed near the blocking junction area thus causes the TVS to fail.

Therefore, a need still exists to provide new manufacture methods for the TVS devices with improved processes to produce new device structures such that the above discussed problems and limitations can be resolved.

SUMMARY OF THE PRESENT INVENTION

It is therefore an aspect of the present invention to provide an improved TVS structural configurations manufactured with new and improved processes to provide better surge performance without compromising the voltage clamping capabilities of the TVS devices.

In the present invention, the steering diodes are integrated with a main Zener diode where the high-side diode, the low-side diode and the main Zener diode are all manufactured as vertical diodes in a semiconductor substrate with simplified layer structures. The high-side diode overlaps with the main Zener diode such that the TVS device occupies significantly less area. Meanwhile, the device configuration is improved by forming multiple PN junctions with a laterally extended N-buried layer in a P epitaxial layer below a N− top dopant layer and a P+ contact region to constitute a bottom Zener diode and simultaneously function as a silicon controlled rectifier (SCR) acting as a high side steering diode. The device further significantly reduces the capacitance because of the series connection of the equivalent capacitances formed by the PN junctions of the SCR. In a preferred embodiment, the N− top dopant layer has low doping concentration, which further decreases the capacitance. Preferably, the N− top dopant layer portion of the SCR is floating and completely depleted at a zero bias so that the SCR functions like a normal diode with low capacitance. Therefore, the above discussed technical difficulties and challenges are resolved.

Briefly in a preferred embodiment this invention discloses a transient-voltage suppressing (TVS) device disposed on a semiconductor substrate of a first conductivity type. The TVS device includes a plurality of contact trenches opened and extended to a lower part of the epitaxial layer filled with a doped polysilicon layer of a second conductivity type where the trenches are further surrounded by a heavy dopant region of the second conductivity type; and a metal contact layer disposed on a top surface of the epitaxial layer electrically connected to a Vcc electrode where the metal contact layer further directly contacts the doped polysilicon layer and the heavy dopant region of the second conductivity type.

In another preferred embodiment, the epitaxial layer is a P-type epitaxial layer and the contact trenches are filled with an N-doped polysilicon layer surrounded by an N-type heavy dopant region. In another preferred embodiment, the epitaxial layer is an N-type epitaxial layer and the contact trenches are filled with a P-doped polysilicon layer surrounded by a P-type heavy dopant region. In another preferred embodiment, the contact trenches are filled with an N-doped polysilicon layer surrounded by an N-type heavy dopant region; and the contact metal layer is electrically connected to a cathode electrode. In another preferred embodiment, the TVS device further includes a top dopant layer of the second conductivity type disposed near the top of said epitaxial layer. The TVS device further includes a buried dopant region of the second conductivity type disposed and encompassed in the epitaxial layer where the buried dopant region interfaces with underlying portions of said epitaxial layer thus constituting a Zener diode for said TVS device; and a first contact region of the first conductivity type disposed on the top of the top dopant layer over the buried dopant region for constituting a semiconductor controlled rectifier (SCR) functioning as a first steering diode, where the SCR comprises vertically of the first contact region, the top dopant layer, the epitaxial layer, and the buried dopant region where the first contact region is disposed at a distance away and insulated from the contact trenches, and the buried dopant region of the second conductivity type further extends laterally and merges with the heavy dopant regions of the second conductivity type below the contact trenches.

In another preferred embodiment, the TVS device includes a plurality of isolation trenches isolating a section of the epitaxial layer and the top dopant layer for isolating the SCR from the contact trenches. In another preferred embodiment, the TVS device further includes a second contact region of the second conductivity type disposed at the top of the top dopant layer and laterally extending in opposite side of the contact trenches from the SCR and first steering diode, where the second contact region interfaces with the top dopant layer functions as a second steering diode and together with the first steering diode forming a pair of steering diodes of the TVS device. In another preferred embodiment, the first and second steering diodes form a pair of steering diodes comprising a high side steering diode and a low side steering diode on two opposite sides of the contact trenches surrounded by the dopant regions of the second conductivity type. In another preferred embodiment, the second steering diode further includes a part of the top dopant layer for reducing the capacitance of the second steering diode. In another preferred embodiment, the first and second steering diodes are connected to an input/output (I/O) pad through the first and second contact regions, respectively.

In another preferred embodiment, the TVS device further comprises isolation trenches surrounding the first and second steering diodes for insulating the first and second steering diodes from the contact trenches. In another preferred embodiment, the first steering diode, the second steering diode and the contact trenches are separated by at least one isolation trench. In another preferred embodiment, the TVS device further comprises a voltage breakdown (VBD) trigger zone formed with a high dopant concentration of first conductivity type in a Zener diode overlapping zone disposed in the epitaxial layer below the buried dopant region to control a voltage breakdown.

In another preferred embodiment, the TVS device further comprises an insulation layer covering a top surface of the semiconductor substrate having openings for forming a metal contact layer contacting with the doped conductive layer disposed in the contact trenches. In another preferred embodiment, the first conductivity type is P-type and the semiconductor substrate functions as a ground voltage (GND) terminal.

This invention further discloses a method for manufacturing a transient voltage suppressing (TVS) device. The method includes steps of a) growing an epitaxial layer having a first conductivity type on a semiconductor substrate of the first conductivity type and opening a plurality of contact trenches in the epitaxial layer followed by implanting a dopant region of a second conductivity type below the trenches in the epitaxial layer; and b) filling the contact trenches with a doped conductive layer of the second conductivity type followed by applying a mask to form dopant regions of the second conductivity type near the top surface of the epitaxial layer followed by applying an elevated temperature to diffuse the dopant regions below each of the contact trenches to diffuse and surround the contact trenches in the epitaxial layer. In another preferred embodiment, the method further includes a step of c) forming a top insulation layer on top of the epitaxial layer and opening plurality of contact openings in the top insulation layer followed by forming a contact metal layer for contacting with the doped conductive layer filled in the contact trenches and the dopant regions of the second conductivity type surrounding the contact trenches.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIG. 2 is a cross sectional view of an improved TVS device structure as an embodiment of this invention.

FIGS. 3A to 3F are a series of cross sectional views for illustrating the manufacturing processes for making the TVS device of this invention.

FIG. 4A is a cross sectional view of an improved TVS device of this invention that includes integrated Zener diode with the depleted SCR high side structure and the low side steering diode.

FIG. 4A-1 shows the equivalent circuit of this device structure.

FIG. 4B is a close up view taken from the top of FIG. 4A showing the equivalent capacitances of the circuit. FIG. 4C is the same cross sectional view as shown in FIG. 4A-1, but with the conductivity types reversed.

FIGS. 5A to 5K are cross sectional views for illustrating the forming of the TVS device of FIG. 4A

DETAILED DESCRIPTION OF THE METHOD

Figure 1:
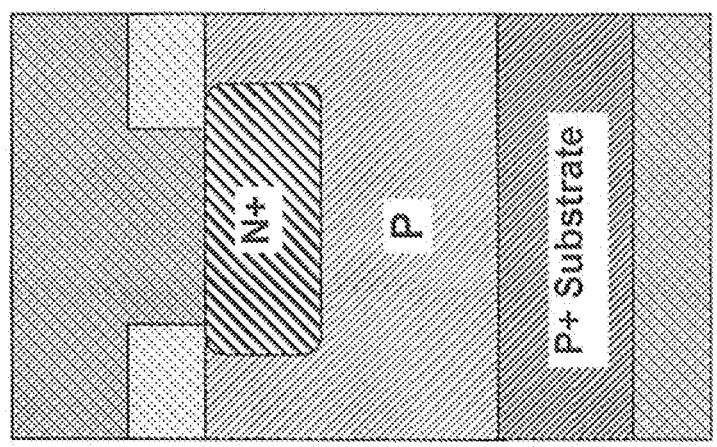
FIG. 1 shows a conventional TVS device with the blocking junction formed by a topside N diffusion and disposed near the surface of a conventional TVS circuit implemented with diode array commonly applied for electrostatic discharge (ESD) protection.

This Patent Application is related to application Ser. No. 13/720,140 filed on Dec. 19, 2012 by a common inventor of this Application and issued into U.S. Pat. No. 8,835,977. Application Ser. No. 13/720,140 is a Divisional Application of another application Ser. No. 12/384,185 filed on Mar. 31, 2009 and now issued into U.S. Pat. No. 8,338,854. The disclosures of application Ser. Nos. 12/384,185 and 13/720, 140 are hereby incorporated by reference in this Patent Application.

FIG. 2 is a cross sectional view of a TVS structure 100 supported on a P-type epitaxial layer 105 supported on a semiconductor substrate (not shown) according to an embodiment of the present invention. The TVS structure includes a plurality of trenches filled with N+ polysilicon layer 120 and the trenches are surrounded by N+ dopant regions 110. Preferably the trenches are opened from the top surface of the epitaxial layer 105 and extend into a lower portion of the epitaxial layer 105. A metal contact layer 150 is in contact with the N+ polysilicon layer 120 and the N+ dopant regions 110. The metal contact layer 150 is further insulated from the I/O pad (not shown) of the TVS device by an interlayer dielectric (ILD) layer 140, e.g., a BPSG layer. In one preferred embodiment, the N+ polysilicon layer 120 extend above the top surface of the epitaxial layer such that the top portion of the N+ polysilicon layer 120 extending above the top surface of the epitaxial layer contacts the metal contact layer 150 on its entire surface. N+ dopant regions 110 extends over the entire epitaxial layer between adjacent trenches. The N+ dopant regions 110 further include a surface portion 130 adjacent the top surface of the epitaxial layer extending laterally to a width wider than a width of the rest of the N+ dopant regions 110 surrounding the side walls of the trenches below the surface portion.

In the TVS structure of this invention, the peak E field and the voltage blocking region are moved significantly down into the bulk region of the epitaxial layer 105 in the semiconductor substrate. The deep junction region is formed without a need for applying an extreme thermal cycle by using deep trenches. The trenches are filled with N+ doped polysilicon layer 120 to allow excellent current conduction. Because of the good conductivity in the upper parts of the TVS structure, there is no E field on the device topside; therefore, the polysilicon region is field free. The major power dissipation at high surge event happens at junction area, which is pushed deep down into silicon, further away from metal. Therefore, this configuration resolves the problem of metal overheating and device failures encountered by the conventional TVS structure when large energy dissipation occurs in a high voltage surge.

FIGS. 3A to 3F are a series of cross sectional views for showing the manufacturing processes to make a TVS structure 100 of FIG. 2 according to an embodiment of the present invention. In FIG. 3A, an oxide layer 109 is formed on top of silicon epitaxial layer 105 as a hardmask for a subsequent trench etch process. A plurality of trenches 107 are then formed from the top surface of the epitaxial layer 105, preferably extending into a lower portion of the epitaxial layer 105. In FIG. 3B, a sacrificial oxide layer is formed (not shown) followed by a phosphorus dopant implantation through the trenches 107 to form dopant regions 110 below the bottom surface of the trenches 107. In an exemplary process the phosphorus implantation is carried out with dopant concentration of 5e14 and implant energy of 200 Kev. In FIG. 3C, the sacrificial oxide layer (not shown) is removed followed by carrying out an insitu polysilicon deposition to form the polysilicon layer 120 to fill in the trenches and covering over the top surface of the oxide layer 109. In FIG. 3D, an etch-back process is performed to etch back the polysilicon layer 120 to the top surface of the oxide layer 109 followed by an oxide etch to strip the oxide layer 109 from the top surface of the epitaxial layer 105. In exemplary processes the polysilicon may be etched with dry etch of CMP and the oxide can be etched by either a dry or wet etch while the wet etch process is preferred. In FIG. 3E, a mask (not shown) is applied to implant dopant ions, e.g., phosphorus or Arsenide, to form regions 130 near the top surface of the epitaxial layer 105 followed by removing the mask (not shown). In FIG. 3F, a diffusion process at a temperature of 1150 degrees Celsius is performed for 30 minutes for the dopant regions 110 and region 130 to diffuse and merge together around the trenches filled with the polysilicon layer 120. Then an interlayer dielectric (ILD) layer 140 composed of an insulation material is formed on the top surface followed by applying a contact mask (not shown) to etch and open contact openings in the ILD layer 140. A metal layer 150 is deposited as a metal contact to region 130 and the polysilicon layer 120 filled in the trench followed by applying a metal mask (not shown) to etch and pattern the metal contact layer 150. Then the metal mask (not shown) is removed.

FIG. 4A is a cross sectional view of a TVS device 200 including a transient voltage suppressor (TVS) structure of FIG. 2 according to an embodiment of the present invention. The TVS device 200 as shown is formed with a depleted SCR high side structure using a buried N+ layer 220 in a P type epitaxial region. i.e., P− epitaxial layers 210-1 and 210-2, with the addition of P and N type regions, e.g., regions 240 and 250 implanted from the top surface. The high side diode is formed by a P+/N−/P−/N+ (or N+/N−/P−/P+) doping profile, i.e., junctions formed between regions 250/215/210-2/220, to achieve a lower junction capacitance. Specifically, the TVS device 200 is formed on a heavily doped P+ semiconductor substrate 205 which supports lightly doped P− epitaxial layers 210-1 and 210-2. An N− compensation dopant layer 215 is located near the top of P− epitaxial layer 210-2. The TVS device 200 includes a P+ contact region 250 formed near a top surface of the P− epitaxial layer 210-2, above the N buried region 220, to enhance the electrical contact with the I/O pad 270. As mentioned above, the TVS device 200 includes an N+ buried region 220 formed in the P− epitaxial layer 210-1 and 210-2. A semiconductor controlled rectifier (SCR) 230-1 is formed between the P+ contact region 250 and the N+ buried layer 220-2, and acts as the first steering diode, which in this case is the high side steering diode. The SCR 230-1 is formed vertically from P+ contact region 250 through the N− compensation dopant layer 215 and P− epitaxial region 210-2 to the N+ buried layer 220. The N+ buried region 220 is formed with an extended length beyond isolation trenches 239 to function with the P− epitaxial layer 210-1 below it as the main Zener diode 230-3 for the TVS device 200. Deep isolation trenches 239 are used to define the boundary of the high side diode. The isolation trenches 239 reduces the side wall P-N junction capacitance resulting from the use of N+ sinker 110, since without isolation trenches 239, N+ sinker 110 can be used surrounding the diode area as isolation thus resulting junction capacitance. The isolation trenches 239 also help avoid parasitic transistor action. The isolation trenches are filled with a dielectric such as oxide, which has a lower dielectric constant compared to silicon in order to further reduce any sidewall coupling capacitance. The presence of oxide filled trenches 239 also plays an important role in reducing the I/O-pad to substrate ground capacitance. The input/output (I/O) Pad capacitance is further reduced by the use of multiple isolation trenches in this device structure. In an alternative embodiment, the isolation trenches 239 may comprise a polysilicon center enclosed by oxide. The oxide filled trenches 239 may be placed surrounding the first steering diode 230-1 in the areas where the I/O pad 270 is located to help reduce the I/O pad to substrate ground capacitance. A Zener diode 230-3 in the overlapping zone is optionally formed with a deep voltage breakdown (VBD) trigger implant layer 221 implanted with P+ dopant ions disposed between the epitaxial layer 210-1 and the N+ buried layer 220 disposed below the upper N compensation layer 215 to control the voltage breakdown.

An N+ doped contact region 240 is formed on top of a second steering diode 230-2 (which in this configuration is the low side steering diode) formed between the P− epitaxial layer 210-2 and the upper N− compensation dopant layer 215. The N+ contact region 240 is formed to enhance the electrical contact, which is connected to the I/O pad in a third dimension (not shown). The second steering diode 230-2 is connected to the Zener diode through the heavily doped semiconductor substrate 205. The low side steering diode 230-2 is isolated from the high side steering diode 230-1 in the semiconductor regions by lateral distance and isolation trenches 239 to prevent a latch up in the semiconductor regions. An oxide insulation layer 245 covering the top surface of the P− epitaxial layer 210-2 has openings to allow the I/O pad 270 to make contact to contact regions 250 and 240, respectively.

The new TVS structure as that shown in FIG. 2 is also implemented in the TVS device 200. Between the isolation trenches 239 with the high side and low side steering diodes isolated on two opposite sides of the P− epitaxial layer 210-2, the TVS structure same as the structure 100 shown in FIG. 2 with a plurality of trenches filled with N+ doped polysilicon layer 120 surrounded by N+ dopant regions 110 are formed to link the N+ buried layer 220 to the Vcc pad 150. A low impedance connection to the N+ buried layer is then formed.

FIG. 4A-1 shows an equivalent circuit of the TVS device 200 of FIG. 4A. To an external device, the TVS device 200 functions with the characteristics just like a single Zener diode 230-4 having low capacitance, but internally the TVS device comprises a main Zener diode 230-3 working in conjunction with a high side steering diode 230-1 and a low side steering diode 230-2.

FIG. 4B is a close up view taken a top portion of the TVS device 200 of FIG. 4A showing the equivalent capacitances of the circuit wherein the SCR is configured so that the P− epitaxial layer 210-2 of the SCR is also depleted. TVS device as shown has the benefit of significantly reduced capacitance because of the extra junctions formed between these PN interfacial layers. In the prior art, the high side diode only comprised a single PN junction. The capacitance from this single junction could be undesirably high, and at risk to process variations. In this invention the SCR 230-1 has three PN junctions, with three corresponding capacitances 135-1, 135-2 and 135-3 in series, resulting in a low equivalent capacitance. In addition, the TVS of this invention requires less area than the two-series steering diodes. The TVS device of this invention has the additional benefit in lowering the capacitance of the second (low side) steering diode 230-2. Without N− top dopant layer 215, the PN junction of the low side steering diode 230-2 would be between the N+ contact region 240 and the P− epitaxial 210-2 resulting in a relatively high capacitance. In this invention, that PN junction is shifted to between the N− top dopant layer 215 and the P− epitaxial 210-2, resulting in a lower capacitance due to the lower doping concentration of N− top dopant layer 215. The TVS device as shown can also be conveniently integrated and manufactured by applying standard manufacturing processes. As shown in the manufacturing processes below, compared with the conventional TVS devices, there are no extra masks required.

The TVS device of this invention can also be formed using opposite conductivity types compared to those shown in FIG. 4A. In FIG. 4C, a TVS device 200' is shown where the conductivity types of each region are reversed. For example, the substrate 205' is now N+ rather than P+ and the buried layer 220' is now P+ rather than N+. The polarities of the steering diodes 230-1' and 230-2', and Zener diode 230-3' are also reversed. The first steering diode 230-1' is still a depleted SCR, and serves as the high side steering diode, and is formed vertically up from P+ buried layer 220' to N− epitaxial 210-2', to P− top dopant layer 215' to N+ contact region 250'. The second steering diode 230-2' acts as the low side diode. The main Zener diode 230-3' is in the same relative position but has a reversed polarity, being formed from the P+ buried layer 220' to the N− epitaxial layer 210-1' below. Also the bottom electrode 272 now functions as the Vcc terminal while a top electrode (not specifically shown) is electrically connected to the P+ buried layer 220' to function as the ground terminal.

FIGS. 5A to 5K are a series of cross sectional views for illustrating the processing steps to manufacture the low capacitance TVS device with depleted SCR as shown in FIG. 4 of this invention. FIG. 5A shows a heavily doped P+ substrate 205 with a lightly doped bottom P− epitaxial layer 210-1 grown over it. In FIG. 5B, a masked implant (mask not shown) is performed to form the N+ implant buried region 220 and P+ trigger implants 221. In FIG. 5C, the top P− epitaxial layer 210-2 is grown over the bottom P− epitaxial layer 210-1 followed by the diffusion of the N+ implant buried region 220. In FIG. 5D a blanket implant is performed to form N− compensation layer 215 at the top of the top P− epitaxial layer 210-2.

FIGS. 5E-5H illustrate the process of forming the TVS structure of FIG. 2, which is similar to the process shown in FIGS. 3A-3E. In FIG. 5E, a hard mask (not shown) is formed on top of P− epitaxial layer 210-2 to function as a hard mask for carrying out a trench etch process. A plurality of trenches 107 are formed in the top portion of the P− epitaxial layer 210-2. In FIG. 5F, a sacrificial oxide layer is formed (not shown) followed by a phosphorus dopant implantation through the trenches 107 to form dopant regions 110 below the bottom surface of the trenches 107. In FIG. 5G, the sacrificial oxide layer (not shown) is removed followed by carrying out an in-situ polysilicon deposition to form the polysilicon layer 120 to fill in the trenches following by the etching back of the polysilicon layer 120 to the top surface of the N− compensation layer 215. Then, a mask (not shown) is applied to implant dopant ions, e.g., phosphorus or arsenide, to form regions 130 near the top surface of the N− compensation layer 215 followed by removing the mask (not shown). In FIG. 5H, a diffusion process at a temperature of 1150 degrees Celsius is performed for 30 minutes for the dopant regions 110 and region 130 to diffuse and merge together around the trenches filled with the polysilicon layer 120 and merge with the N+ buried layer 220.

In FIG. 5I, a trench mask (not shown) is applied to open the isolation trenches 239 followed by filling the trenches with insulation material (which may include a polysilicon center). In FIG. 5J, implant masks (not shown) are applied to form the N+ contact regions 40 and P+ contact regions 250 near the top surface of the N− compensation dopant layer 215 to function as the low side and high side diodes. The N− dopant layer 215 may be formed either by implantation, or by epitaxial growth. If top dopant layer 215 is formed by blanket implantation or epitaxial growth, this TVS device requires no extra masks compared to a similar TVS device not employing a depleted SCR. The configuration (e.g., doping profile, region widths) of the SCR may be selected so that the SCR is depleted at a zero bias. The manufacturing processes proceed with the formation of the top insulation layer 245, the metal contact layer 150 and the input/output pad 270. In FIG. 5K, a bottom electrode 272 may be formed under the P+ substrate 205 as the GND pad to complete the manufacturing processes of the TVS device.

According to above descriptions, this invention discloses a method for manufacturing a transient voltage suppressing (TVS) device. The method comprises steps of a) growing a lower epitaxial layer having a first conductivity type on a semiconductor substrate of the first conductivity type and applying an implant mask to implant a buried dopant layer of the first conductivity type then growing a top epitaxial layer of the first conductivity type on top of the lower epitaxial layer followed by blanket implanting a top compensation layer of a second conductivity type near a top surface of the top epitaxial layer and opening a plurality of contact trenches in the upper epitaxial layer then implanting a trench-bottom dopant region of a second conductivity type below each of the contact trenches in the top epitaxial layer; b) carrying out a deposition process to form a conductive trench-filling layer to fill in the contact trenches followed by the etching back the conductive trench-filling layer to the top compensation layer followed by applying a mask to implant dopant regions near the top surface of the top compensation layer followed by carrying out a diffusion process to diffuse trench-bottom dopant region to surround the contact trenches and to merge with the buried dopant layer; and c) applying a trench mask to open a plurality of isolation trenches followed by filling the isolation trenches with an insulation material. In an preferred embodiment, the method further includes a step of d) applying a contact region mask to implant contact dopant regions near a top surface of the top compensation layer to function as a high side diode and a low side diode. In another preferred embodiment, the method further includes a step of e) forming a top insulation layer and applying a mask to open contact openings through the top insulation layer followed by forming and patterning a top metal contact layer to function as input/output pad to contact the high side and low side diodes and Vcc metal contact for contacting the contact trenches for electrically connecting to the buried dopant layer.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A transient voltage suppressing (TVS) device formed in an epitaxial layer of a first conductivity type supported on a semiconductor substrate, and the TVS device further comprising:
    a plurality of contact trenches opened and extended into the epitaxial layer of the first conductivity type wherein the contact trenches are filled with a doped polysilicon layer of a second conductivity type and wherein the contact trenches are further surrounded by a heavy dopant region of the second conductivity type to form a P-N junction with the epitaxial layer of the first conductivity type; and
    a metal contact layer disposed on a top surface of the epitaxial layer of the first conductivity type electrically connected to a Vcc electrode wherein the metal contact layer further directly contacting the doped polysilicon layer and the heavy dopant region of the second conductivity type.

2. The transient voltage suppressing (TVS) device of claim 1 wherein:
    the epitaxial layer is a P-type epitaxial layer and the contact trenches are filled with an N-doped polysilicon layer surrounded by an N-type heavy dopant region to form the P-N junction with the P-type epitaxial layer.

3. The transient voltage suppressing (TVS) device of claim 1 wherein:
    the epitaxial layer is an N-type epitaxial layer and the contact trenches are filled with a P-doped polysilicon layer surrounded by a P-type heavy dopant region to form the P-N junction with the N-type epitaxial layer.

4. The transient voltage suppressing (TVS) device of claim 1 wherein:
    the contact trenches are filled with a N-doped polysilicon layer surrounded by a N-type heavy dopant region to form the P-N junction with a P-type epitaxial layer; and
    the contact metal layer is electrically connected to a cathode electrode.

5. The transient voltage suppressing (TVS) device of claim 1 further comprising:
    a top dopant layer of the second conductivity type disposed near the top of said epitaxial layer of the first conductivity type;
    a buried dopant region of the second conductivity type disposed below the contact trenches and encompassed in the epitaxial layer; wherein said buried dopant region interfacing with an underlying portion of said epitaxial layer to constitute a Zener diode for said TVS device; and
    a first contact region of the first conductivity type disposed on the top of said top dopant layer of the second conductivity type over said buried dopant region, wherein the first contact region of the first conductivity type, the top dopant layer of the second conductivity type, the epitaxial layer of the first conductivity type, and the buried dopant region of the second conductivity type constitute a vertical semiconductor controlled rectifier (SCR) to function as a first steering diode of the TVS device and wherein the first contact region of the first conductivity type is disposed at a distance away and insulated from the contact trenches, and the buried dopant region of the second conductivity type further extends laterally and merges with the heavy dopant regions of the second conductivity type below the contact trenches.

6. The transient voltage suppressing (TVS) device of claim 5 further comprising:
    a plurality of isolation trenches isolating a section of said epitaxial layer of the first conductivity type and the top dopant layer of the second conductivity type for isolating said SCR from the contact trenches.

7. The transient voltage suppressing (TVS) device of claim 5 further comprising:
    a second contact region of the second conductivity type disposed at the top of said top dopant layer of the first conductivity type and laterally in opposite side of the contact trenches from the SCR and first steering diode wherein said second contact region interfacing with the top dopant layer for functioning as a second steering diode for functioning with said first steering diode as a pair of steering diodes of said TVS device.

8. The transient voltage suppressing (TVS) device of claim 5 further comprising:
    a second steering diode formed laterally away from the SCR and first steering diode,
    wherein said first and second steering diodes form a pair of a high side steering diode and a low side steering diode on two opposite sides of the contact trenches surrounded by the dopant regions of the second conductivity type.

9. The transient voltage suppressing (TVS) device of claim 8 wherein:
    the second steering diode further includes a part of the top dopant layer of the second conductivity type for reducing the capacitance of said second steering diode.

10. The TVS device of claim 8 wherein:
    the first and second steering diodes are connected to an input/output (I/O) pad through the first and second contact regions of the first conductivity type, respectively, disposed near the top surface of the top dopant layer of the second conductivity type.

11. The TVS device of claim 8 further comprising:
    isolation trenches surrounding the first and second steering diodes for insulating the first and second steering diodes disposed on two opposite sides of the contact trenches.

12. The transient voltage suppressing (TVS) device of claim 8 wherein:
   the first steering diode, the said second steering diode and the contact trenches are separated by at least one isolation trench.

13. The transient voltage suppressing (TVS) device of claim 5 further comprising:
   a voltage breakdown (VBD) trigger zone formed with a high dopant concentration of the second conductivity type in a Zener diode overlapping zone disposed in the epitaxial layer below said buried dopant region to control a voltage breakdown.

14. The transient voltage suppressing (TVS) device of claim 1 further comprising:
   an insulation layer covering a top surface of the semiconductor substrate having contact openings filled with a metal contact layer to contact the contact trenches.

15. The transient voltage suppressing (TVS) device of claim 1 wherein:
   said first conductivity type is P-type; and said semiconductor substrate is electrically connected to a ground voltage (GND) terminal.

* * * * *